US012620972B2

(12) United States Patent
Lehnert et al.

(10) Patent No.: US 12,620,972 B2
(45) Date of Patent: May 5, 2026

(54) MINIMALLY DIFFRACTING SURFACE-ACOUSTIC-WAVE RESONATOR

(71) Applicants: THE REGENTS OF THE UNIVERSITY OF COLORADO, A BODY CORPORATE, Denver, CO (US); Government of the United States of America as represented by the Secretary of Commerce, Gaithersburg, MD (US)

(72) Inventors: Konrad Lehnert, Boulder, CO (US); Alec Emser, Boulder, CO (US); Lucas Sletten, Boulder, CO (US); Brendon Rose, Westminster, CO (US)

(73) Assignees: The Regents of the University of Colorado, a body corporate, Denver, CO (US); Government of the United States of America, as represented by the Secretary of Commerce, Gaithersburg, MD (US)

( * ) Notice: Subject to any disclaimer, the term of this patent is extended or adjusted under 35 U.S.C. 154(b) by 719 days.

(21) Appl. No.: 18/115,242

(22) Filed: Feb. 28, 2023

(65) Prior Publication Data

US 2023/0336156 A1     Oct. 19, 2023

Related U.S. Application Data

(60) Provisional application No. 63/268,630, filed on Feb. 28, 2022.

(51) Int. Cl.
| | |
|---|---|
| *H03H 9/25* | (2006.01) |
| *H03H 9/02* | (2006.01) |
| *H03H 9/145* | (2006.01) |

(52) U.S. Cl.
CPC .......... *H03H 9/25* (2013.01); *H03H 9/02551* (2013.01); *H03H 9/02559* (2013.01); *H03H 9/02842* (2013.01); *H03H 9/145* (2013.01)

(58) Field of Classification Search
CPC .......... H03H 9/02551; H03H 9/02559; H03H 9/02842; H03H 9/02881; H03H 9/145; H03H 9/25
See application file for complete search history.

(56) References Cited

U.S. PATENT DOCUMENTS

| | | | | |
|---|---|---|---|---|
| 5,905,325 A | * | 5/1999 | Naumenko | ........ H03H 9/02606 310/313 A |
| 2021/0305965 A1 | * | 9/2021 | Zhang | ................ H03H 9/02929 |

(Continued)

FOREIGN PATENT DOCUMENTS

| | | | | | |
|---|---|---|---|---|---|
| KR | 20000029388 A | * | 5/2000 | ......... | H03H 9/02551 |

OTHER PUBLICATIONS

Abbott et al., A Minimal Diffraction Cut of Quartz for High Performance Saw Filters, IEEE Ultrasonics Symposium, 2000, pp. 235-240.

(Continued)

*Primary Examiner* — J. San Martin
(74) *Attorney, Agent, or Firm* — Cozen O'Connor

(57)     ABSTRACT

A surface-acoustic-wave (SAW) resonator includes a substrate formed from an anisotropic crystal and first and second acoustic reflectors disposed on a surface of the substrate. The first and second acoustic reflectors face each other to form an acoustic cavity whose axis is aligned with a crystallographic orientation of the anisotropic crystal such that the SAW resonator is minimally diffracting at cryogenic temperatures. The substrate may be a piezoelectric crystal, in which case the acoustic cavity can be excited by driving electrodes located on the surface of the substrate. Since the (Continued)

SAW resonator is minimally diffracting, it has less loss, and therefore can achieve higher Qs, than SAW resonators based on other crystallographic orientations.

20 Claims, 13 Drawing Sheets

(56)                    References Cited

U.S. PATENT DOCUMENTS

2023/0109106 A1 *    4/2023   Hiramatsu   .........   H03H 9/02574
                                                                     310/313 R
2023/0366755 A1 *   11/2023   Courjon   .................   G01L 1/162

OTHER PUBLICATIONS

Aref et al., "Quantum Acoustics with Surface Acoustic Waves", Superconducting Devices in Quantum Optics, 2016, 14 pages.

Cowperthwaite et al., "Optimal Orientation Function For Saw Devices", Jointly with the 17th European Frequency and Time Forum Proceedings of the 2003 IEEE International Frequency Control Symposium and PDA Exhibition, 7 pages.

Magnusson et al., "Surface acoustic wave devices on bulk ZnO crystals at low temperature", Applied Physics Letters, vol. 106, Feb. 2015, 4 pages.

Manenti et al., "Surface acoustic wave resonators in the quantum regime", Physical Review B, vol. 93, 2016, 5 pages.

Sletten et al., "Resolving Phonon Fock States in a Multimode Cavity with a Double-Slit Qubit", Physical Review X, vol. 9, 2019, 9 pages.

Tarumi et al., "Complete set of elastic and piezoelectric coefficients of $\alpha$-quartz at low Temperatures", Journal of Applied Physics, vol. 102, 2007, 6 pages.

* cited by examiner

MINIMALLY DIFFRACTING
SURFACE-ACOUSTIC-WAVE RESONATOR

RELATED APPLICATIONS

This application claims priority to U.S. Provisional Patent Application No. 63/268,630, filed on Feb. 28, 2022, the entirety of which is incorporated herein by reference.

STATEMENT REGARDING FEDERALLY SPONSORED RESEARCH OR DEVELOPMENT

This invention was made with government support under grant number N00014-20-1-2833 awarded by the Office of Naval Research. The government has certain rights in the invention.

BACKGROUND

A surface-acoustic-wave (SAW) resonator uses a cavity to confine acoustic modes along the surface of an elastic substrate. SAW resonators have long been an important component in the telecommunications industry, with applications including filters and delay lines, among others. More recently, low-temperature applications of SAW devices and resonators have gained interest in the field of quantum computing, where applications include isolating superconducting qubits from unwanted interference and implementing long-lived quantum memories. Additionally, in the field of quantum acoustics, acoustic devices can be integrated with superconducting qubits to implement quantum control over mechanical degrees of freedom. Acoustic systems offer quantum technologies a favorable combination of long on-chip delays, competitive coherence times, and the ability to connect disparate quantum systems.

SUMMARY

The present embodiments include surface-acoustic-wave (SAW) devices that reduce diffraction loss for operation at cryogenic temperatures (e.g., less than 10 K). These embodiments achieve this benefit by fabricating the device on a substrate such that SAWs propagate along a particular crystalline orientation of the substrate. This orientation is also referred to herein as a minimally-diffracting (MD) orientation. Some of the present embodiments include a SAW resonator in which a pair of acoustic reflectors (e.g., Bragg mirrors) face each other to create an acoustic cavity. The longitudinal axis of the acoustic cavity coincides with the MD orientation of the substrate at cryogenic temperatures. In other embodiments, a SAW filter or delay line is fabricated such that SAWs propagate parallel to the MD orientation.

BRIEF DESCRIPTION OF THE FIGURES

FIG. 5A shows the unit cell geometry used for unit-cell simulations.

FIG. 5B shows a typical meshing for a unit-cell simulation. The longitudinal dimension is meshed more finely.

FIG. 5C shows the eigenmode for the COLD quartz orientation. Deformation shows displacement in the z dimension.

FIG. 5D shows the coordinate system for the simulations (top) and the crystallographic axes $x_c$, $y_c$ and $z_c$ rotated for COLD quartz (bottom).

DETAILED DESCRIPTION

Acoustic systems are a promising resource which offer quantum technologies a favorable combination of compact footprints, excellent coherence times, and the ability to connect disparate quantum systems [1-9]. The emergent field of circuit quantum acoustodynamics (cQAD) has leveraged these advantages to create hybrid platforms which are capable of exploring fundamental quantum physics and offer the potential for quantum computation with acoustic processors [10-17]. In particular, cQAD experiments utilizing surface acoustic wave (SAW) resonators have demonstrated increasingly sophisticated quantum control over phonons, including phonon number counting, phonon-mediated qubit-qubit entanglement, and multipartite phonon entanglement [12, 18, 19].

In a broad array of hybrid acoustic systems, maximizing coupling between a qubit and mechanical degrees of freedom is achieved by tightly confining mechanical strain [6, 9, 11, 20-22]. It can be difficult, however, to confine the strain without significantly increasing mechanical dissipation rates. In the particular example of cQAD with SAW resonators, this increase in dissipation results mainly from surface wave diffraction [12]. Consider a SAW resonator which is coupled to a nonlinear circuit element via the piezoelectric interaction of an interdigitated transducer (IDT). In such a configuration (see FIG. 1A), the added IDT capacitance reduces the nonlinearity of the superconducting circuit. Thus, for many applications the IDT capacitance must be small, corresponding to a narrow acoustic aperture whose aperture width W is on the order of several times the acoustic wavelength A. However, acoustic diffraction losses in SAW resonators scale quadratically with the inverse of the aperture width causing resonators in this regime to suffer from high loss rates [12]. This loss significantly limits the mechanical coherence time of hybrid systems based on SAW resonators and thus restricts their capabilities for quantum information processing.

Although it is possible to mitigate the deleterious effects of acoustic diffraction by appropriately curving the cavity boundaries, accomplishing this with piezoelectric media is complicated by their inherent anisotropy [3, 23, 24]; anisotropy of phase velocity, electromechanical coupling, and reflectivity must all be considered. Rather than compensating for this anisotropy, it is possible to instead exploit it into naturally suppressing acoustic diffraction. At special orientations of some piezoelectric materials (see FIG. 1), the anisotropy induces an angle-dependent beam-steering such that waves propagate predominantly along one axis of the substrate. The resulting wavefronts are flat and propagate with minimal diffraction spreading. Substrates that exhibit this property are known as minimally diffracting (MD) [1].

Figure 1A:
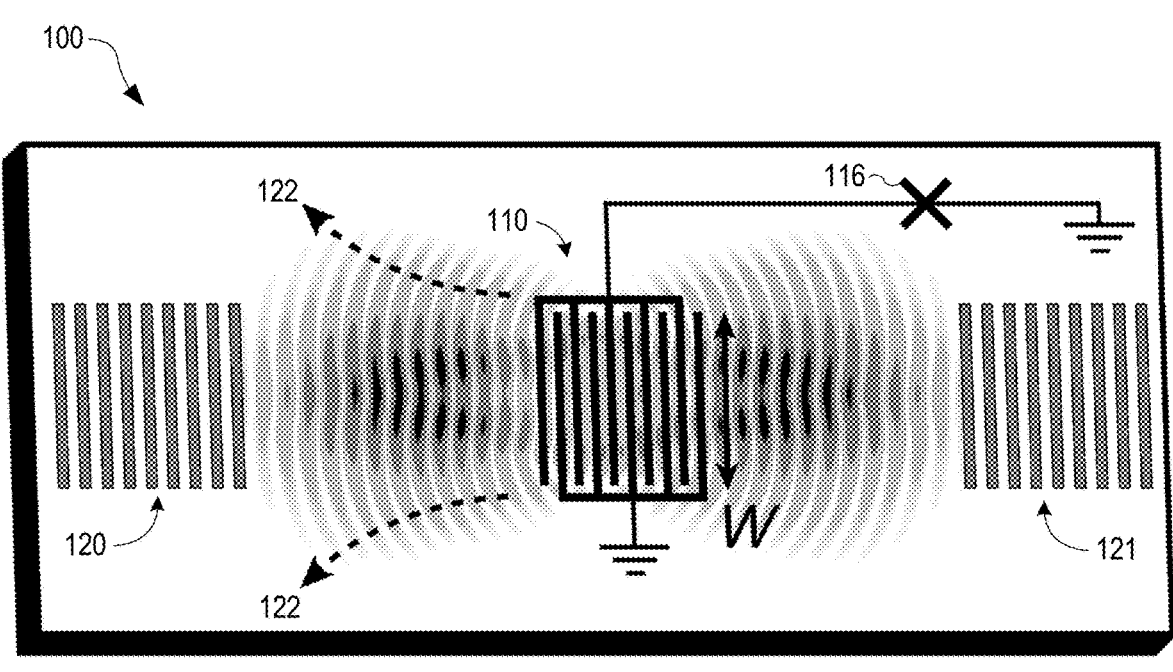
FIGS. 1A and 1B are functional diagrams of surface-acoustic-wave (SAW) resonators for two orientations of quartz.
Figure 1B:
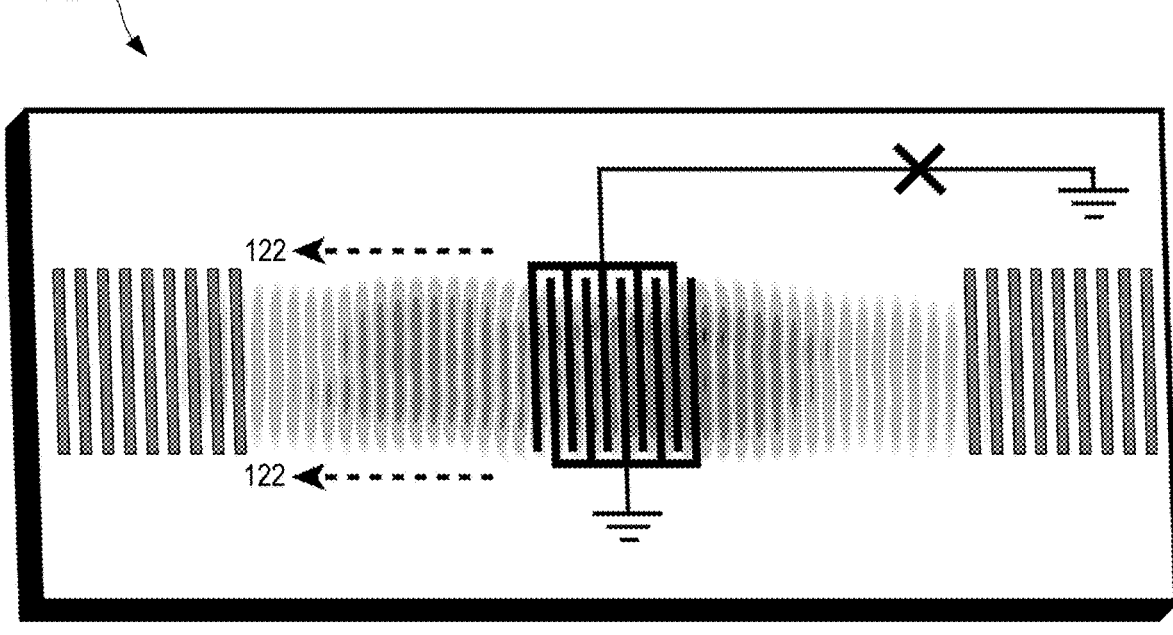

FIGS. 1A and 1B compare SAW diffraction in a resonator for two orientations of quartz. In FIG. 1A, a SAW resonator 100 includes an IDT 110 with aperture width W that is galvanically connected to a nonlinear circuit element 116 denoted (illustrated as x) on ST quartz, a common orientation of quartz for SAW devices. A voltage across the IDT 110 launches SAWs 122, which are confined by acoustic reflectors 120 and 121 to form a multimode acoustic cavity. The IDT 110, circuit element 116, and acoustic reflectors 120 and 121 are shown overlying SAWs shortly after launch in time-domain finite-element simulations. As the SAWs 122 propagate, they diffract outwards and introduce loss in the resonator 100. FIG. 1B shows a SAW resonator 100' that is similar to the SAW resonator 100 of FIG. 1A except that it uses an MD orientation of quartz. SAWs 122 propagate along an MD orientation with less diffraction, facilitating high mechanical quality factors with small IDT capacitances.

The present embodiments utilize MD orientations of piezoelectric crystals that are suitable for cQAD platforms. For experimental demonstrations, we chose quartz for the piezoelectric crystal due its extremely low bulk mechanical losses at millikelvin temperatures and its relatively strong piezoelectricity [25]. An MD orientation of quartz for room-temperature SAW devices was previously identified [26, 27]. However, the temperature dependence of the piezoelectric and elastic coefficients of quartz causes this cut to lose its MD property as it is cooled to ultra-low temperatures. This motivates the search for an orientation of quartz which minimizes SAW diffraction in the low-temperature limit.

We used finite element method (FEM) simulations to model diffraction and beam-steering for ultra-low temperature quartz to identify an MD orientation suitable for quantum experiments. From these simulations, we identify an orientation of quartz at Euler angles $(\psi, \phi, \theta)=(0°, 40.2°, 23.4°)$ [28]. This orientation minimizes SAW diffraction and beam-steering to second-order when cooled to ultra-low temperatures. Experimentally, we fabricated SAW resonators with two flat acoustic reflectors (see FIGS. 1A and 1B) on quartz at this orientation. These devices demonstrated high internal quality factors (~28,000) with very narrow (W~10λ) acoustic apertures. This represents a 25-fold improvement over equivalent resonators on ST quartz [25]. Slightly wider resonators on this substrate (W>25λ) demonstrated extremely high internal quality factors (Q>110, 000); achieving similar quality factors with narrow-aperture resonators on non-MD substrates is nearly impossible without complicated anisotropic focusing procedures. We conclude that this orientation, which we name "Cryogenically Optimized Low Diffraction" (COLD) quartz, exhibits minimal diffraction at millikelvin temperatures.

Figure 2A:
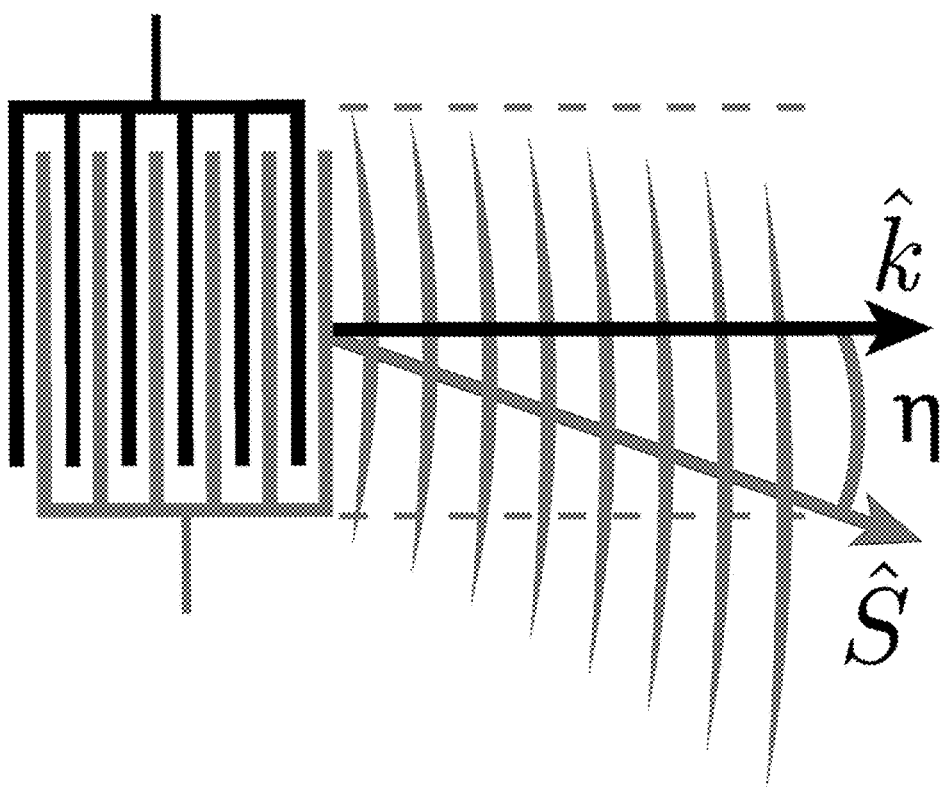
FIG. 2A is a functional diagram of an interdigitated transducer launching SAWs on an anisotropic substrate that exhibits beam-steering.

Minimal diffraction in anisotropic materials can be understood as an effect of beam-steering, a phenomenon that causes a beam in an anisotropic medium to propagate in a direction which is not normal to the wavefront. As shown in FIG. 2A, the beam-steering angle $\eta$ is the difference between the directions of the SAW wave vector $\hat{k}$ and energy flow vector $\hat{S}$. It can be calculated from $v(\theta)$, the SAW phase velocity as a function of planar rotation [1]:

$$\eta(\theta) = \tan^{-1}\left(\frac{1}{v(\theta)}\frac{dv(\theta)}{d\theta}\right) \tag{1}$$

Beam-steering vanishes at angle $\theta_0$ for which $v(\theta)$ exhibits a stationary point. However, any finite-width IDT oriented at $\theta_0$ will transduce SAWs at a spectrum of angles around $\theta_0$ which, on an anisotropic substrate, necessarily exhibit beam-steering. The second-order diffractive spread of the beam width due to this off-axis beam-steering is characterized by the diffraction parameter $\gamma$, $$\gamma = \frac{d\eta}{d\theta}, \tag{2}$$

which can be used to calculate the diffraction-limited quality factor $Q_d$ of a flat SAW cavity on an anisotropic substrate [29], $$Q_d = \frac{5\pi}{|1+\gamma|}(w/\lambda)^2. \tag{3}$$

Figure 2B:
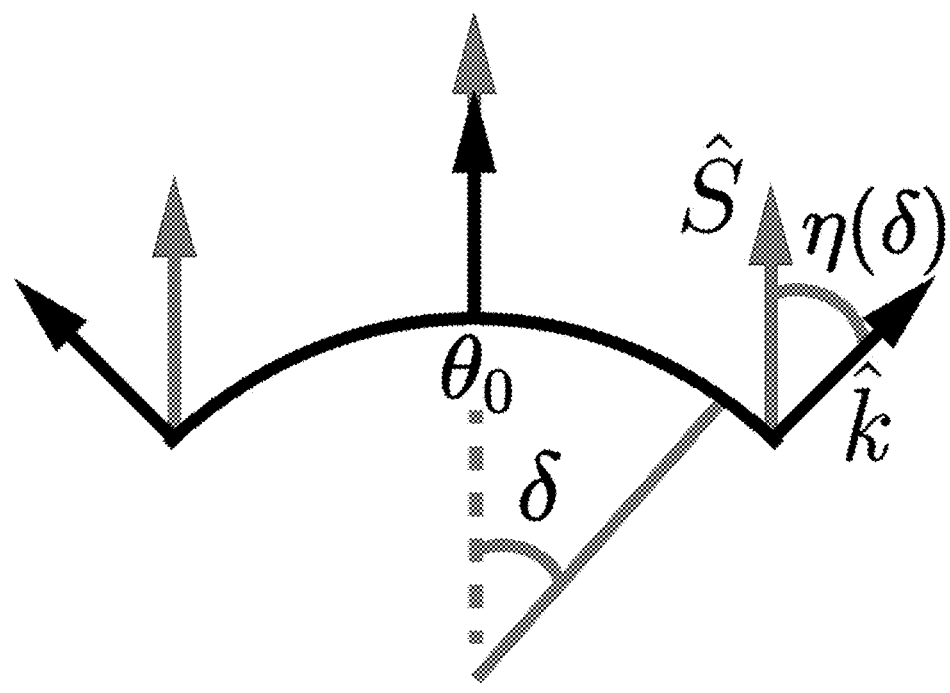
FIG. 2B illustrates minimal diffraction.

Diffraction is reduced (compared to isotropic substrates) for materials where $-2<\gamma<0$ and otherwise increased. ST quartz, for example, exhibits accelerated wave diffraction $\gamma=0.378$ and isotropic materials exhibit $\gamma=0$. Minimal diffraction occurs when $\gamma=-1$, a special condition such that beam-steering at small angles δ around some orientation $\theta_0$ follows $\eta(S) \approx -\delta$. In this circumstance, waves transduced at angle $\theta_0 + \delta$ by a finite-width IDT will propagate in the direction $\theta_0$. Thus when $\gamma = -1$, as shown in FIG. 2B, $\hat{S}$ points in the same direction irrespective of k, and SAWs will propagate with minimal diffraction spreading.

Figure 2C:
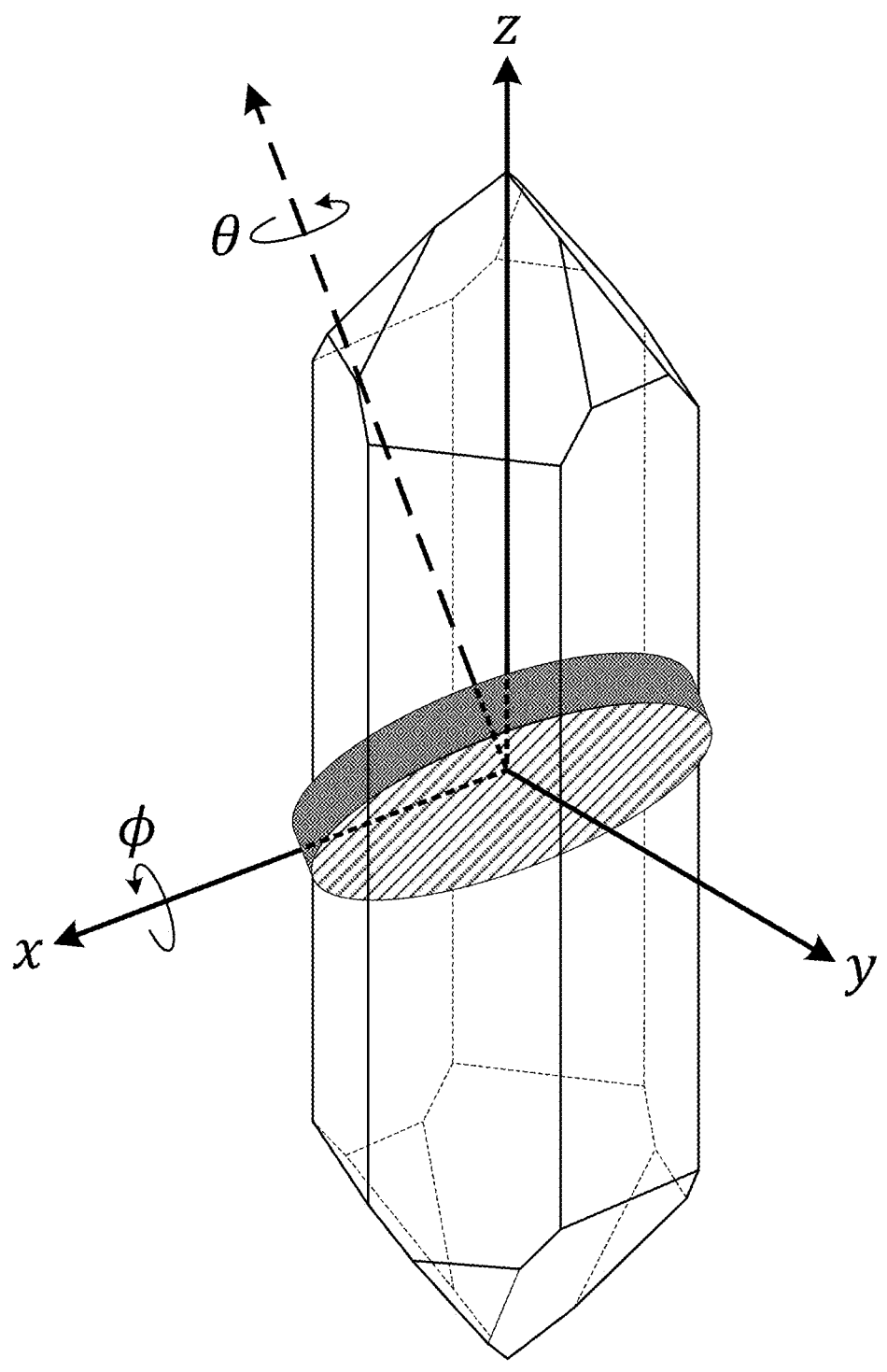
FIG. 2C is a perspective view of a quartz crystal showing a wafer oriented relative to quartz crystallographic axes: $\phi$ determines the angle at which the wafer is cut from a monocrystalline bar and $\theta$ determines the planar rotation of a device about the wafer normal.

We thus search for an orientation of quartz which (i) exhibits $\eta \approx 0°$, (ii) exhibits $\gamma \approx -1$, (iii) and is tolerant to potential errors in manufacturer cutting. Due to the trigonal structure of α-quartz, three Euler angles (ψ, φ, θ) are necessary to uniquely describe the orientation of a device relative to some crystallographic axes [28]. In the following discussion, we consider only cuts where ψ=0°, i.e., singly-rotated cuts. Singly-rotated cuts are easier to cut than doubly-rotated cuts, even though the present embodiments may still work with double-rotated cuts. The remaining angles (φ, θ) are illustrated in FIG. 2C: φ describes the angle between the wafer-normal and the crystallographic Z axis while θ corresponds to a planar rotation about the wafer-normal.

Using FEM simulations, we generated velocity curves v(φ, θ) in the space (ψ, φ, θ)=(0°, −90°:90°, 0°:180°) and applied Eqns. 1 and 2 to calculate η and γ [30]. The basis of the simulations was a 3D unit cell with two pairs of periodic mechanical and electric boundary conditions in the longitudinal and transverse dimensions. An eigenfrequency study revealed surface wave modes for a particular orientation, and the velocity of the lowest frequency mode was traced to produce v(φ, θ). From the simulation we also determined the SAW polarization supported by a given orientation. In particular, we searched for Rayleigh-(R) polarized SAWs, which exhibit less propagation attenuation than shear-horizontal (SH) or other non-Rayleigh polarizations [1]. The crystallographic orientation was specified by rotating the piezoelectric and elastic tensors relative to the unit cell axes. To model low temperature quartz, we used piezoelectric and elastic coefficients for right-handed α-quartz measured at 5 K [31]. Simulated velocity curves for MD (φ=40.2°) and ST (φ=−47.25°) quartz are shown in FIG. 2D.

Figure 2D:
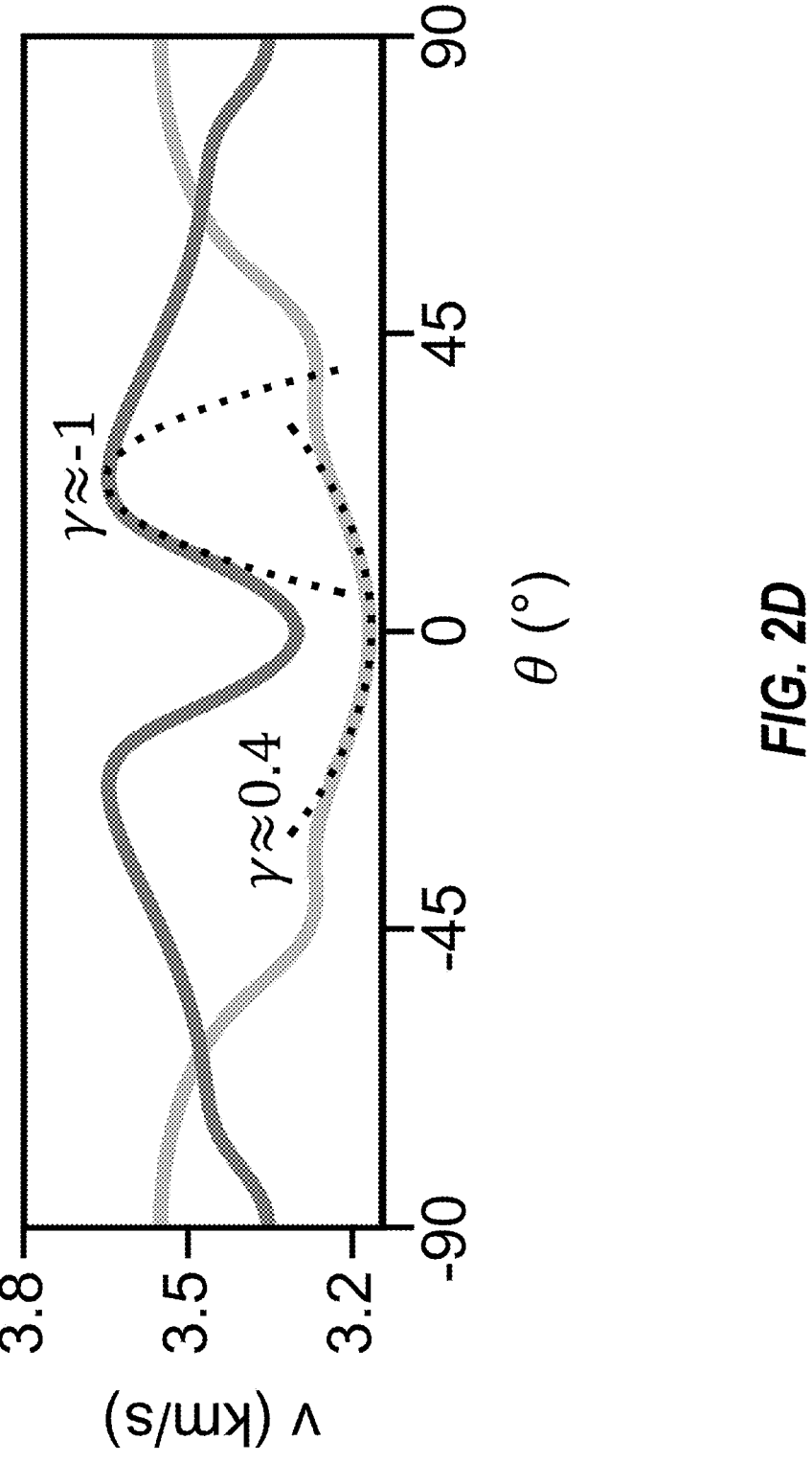
FIG. 2D is a plot of SAW velocity as a function of planar rotation for minimally diffracting (MD) and ST quartz.
Figure 2E:
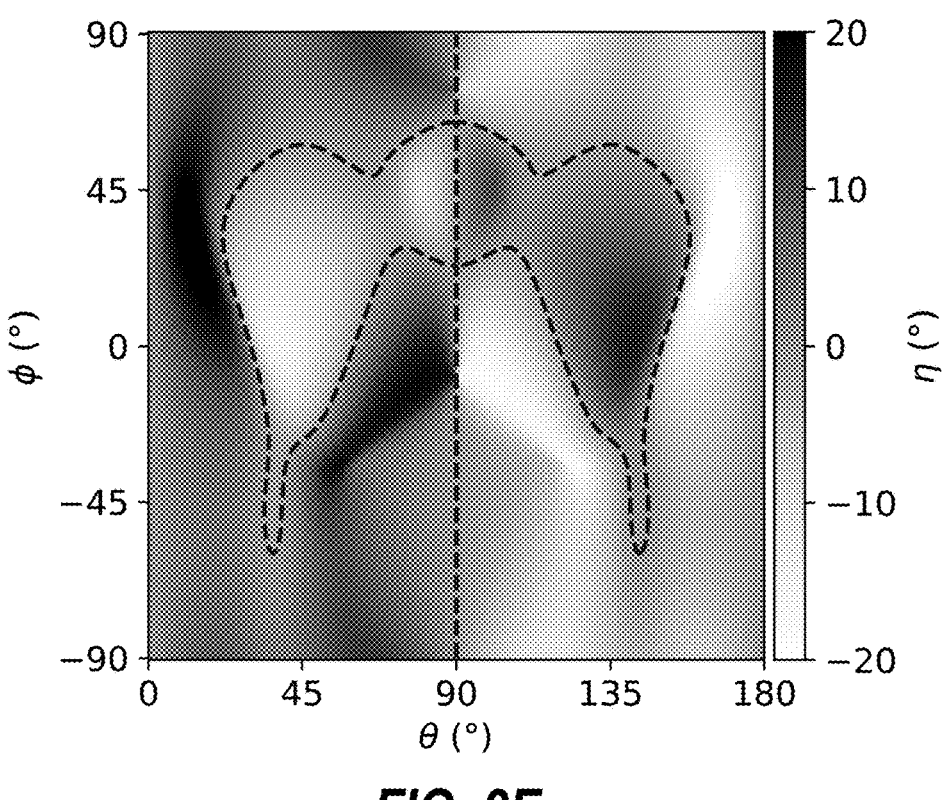
FIG. 2E is a plot of beam-steering angle $\eta$ calculated from simulated velocity profiles for all $\theta$ and $\phi$.
Figure 2F:
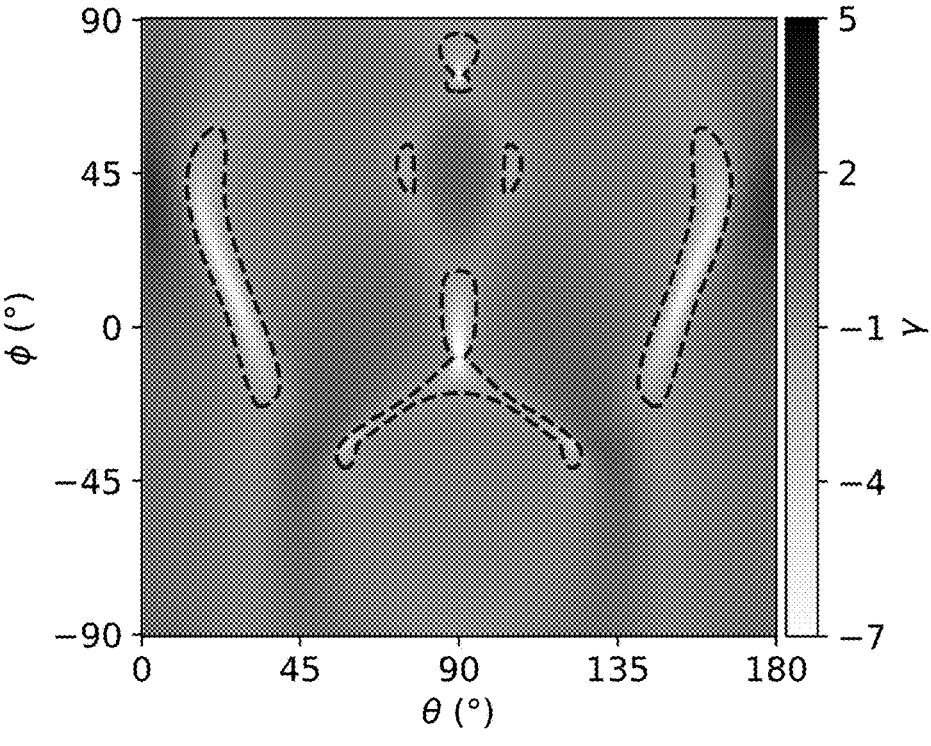
FIG. 2F is a plot of diffraction parameter $\gamma$ calculated from the simulated beam-steering for all $\theta$ and $\phi$.
Figure 2G:
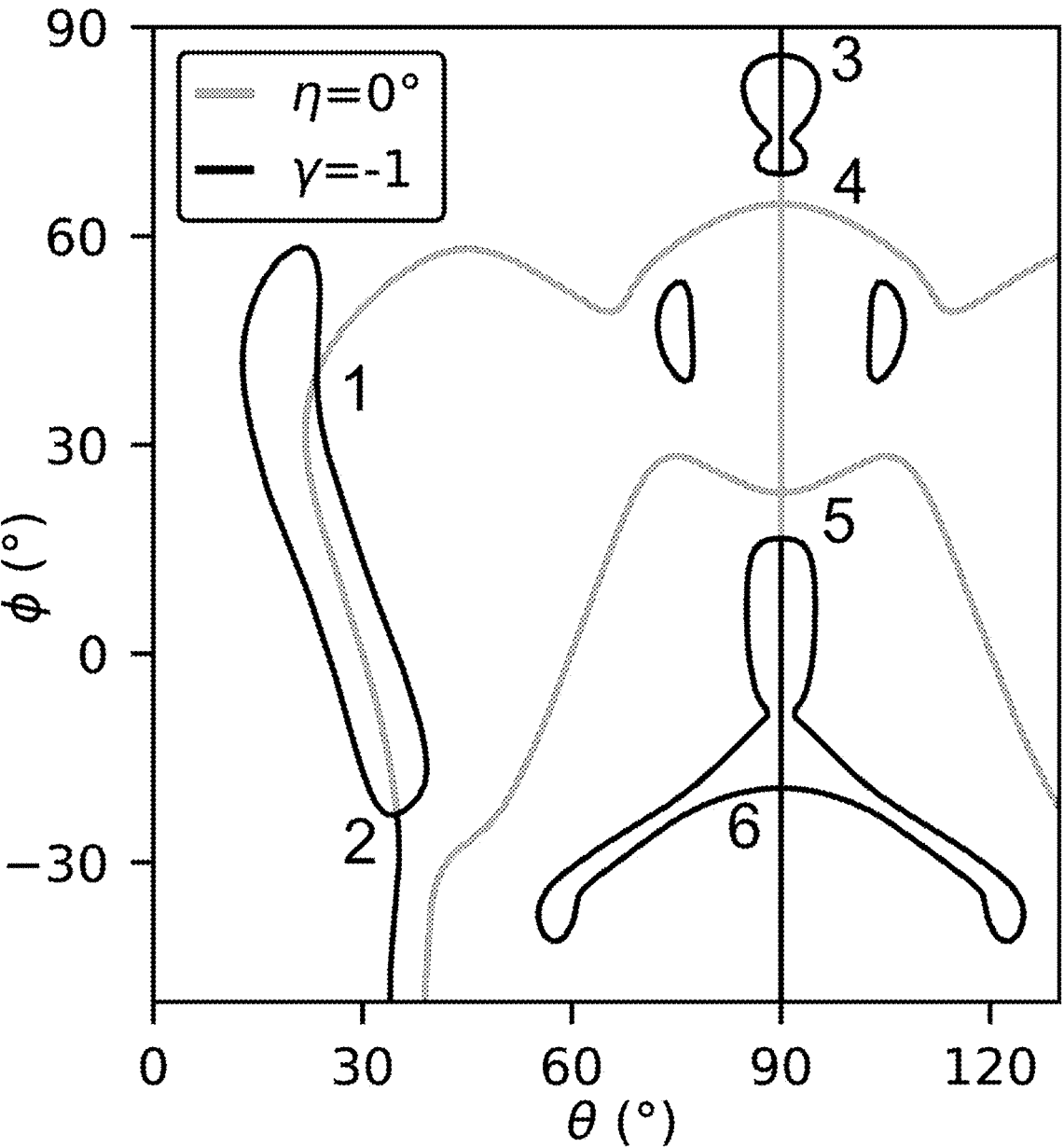
FIG. 2G is a plot of contours for minimal beam-steering and diffraction. The six unique intersections of the curves represent MD orientations.

FIGS. 2D and 2F are plots of η and γ calculated from the simulated velocities. The contours along which beam-steering and diffraction are minimized are plotted in FIG. 2G. Although the six unique intersections of these curves represent potentially desirable cuts, we find that only one is suitable for further study; the relevant properties for each cut are listed in Table 1. To verify that a small error in the wafer cutting will not destroy the MD behavior, we also calculated the sensitivity parameters |dη/dφ| and |dη/dφ|. We find that orientation 1 is Rayleigh-polarized, demonstrates high tolerance to cut errors, exhibits a large electromechanical coupling $k^2$, and minimizes diffraction. We name this orientation "COLD" quartz.

Figures 3A, 3B:
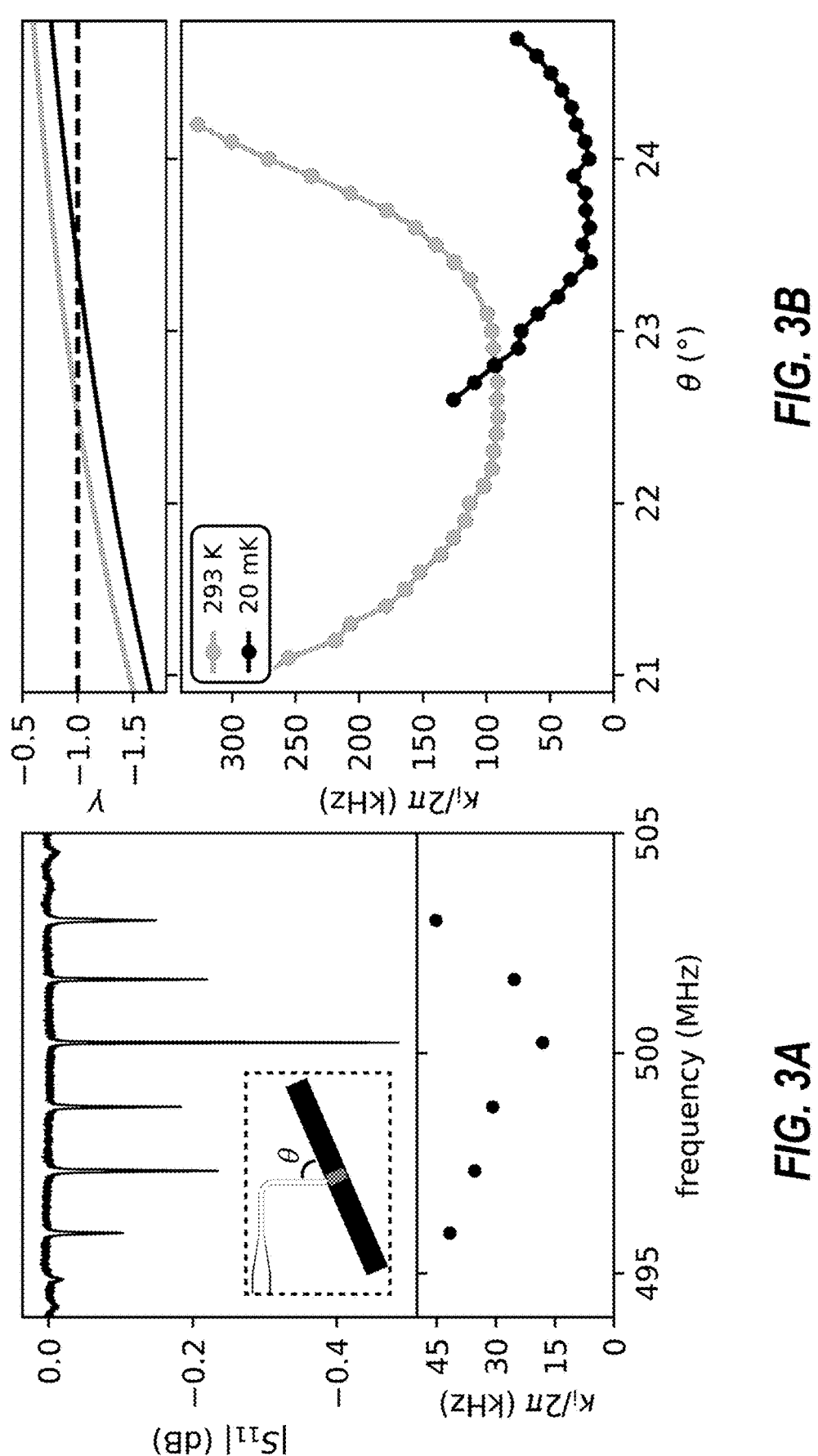
FIG. 3A illustrates a reflection measurement from a one-port SAW resonator fabricated at $\phi$, $\theta=(40.2°, 23.4°)$ and cooled to 20 mK. The resonator (see inset) includes a double-finger IDT and Bragg mirror gratings which are designed with a narrow acoustic aperture ($10\lambda$). Aluminum is etched away to define the coplanar waveguide, IDT, and SAW cavity. The lower portion of the figure is a plot of internal linewidth for each mode.
FIG. 3B illustrates the simulated diffraction parameter $\gamma$ for SAWs on $\phi=40.2°$ quartz at 293 K and 5 K. Minimal diffraction is predicted at $\theta=22.5°$ ($23.4°$) for warm (cold) devices. The lower portion of the figure is a plot of the measured internal linewidth of the central resonator mode of each device as $\theta$ is incremented across many devices. The fit error bars for all data points are smaller than the marker size.

We procured COLD quartz wafers from a vendor with quoted tolerance (±0.1°, ±0.03°, ±0.1°). To test the performance of the substrate, we first fabricated a series of one-port resonators and varied the angle θ at which each device is oriented relative to the crystallographic axes. Double-finger IDTs were patterned from a 25 nm aluminum film, and SAWs were confined by etched Bragg mirror gratings with 250 elements and a reflectivity of 1-2% per element [1, 29]. The resonators were designed with wavelength λ=7.28 μm and a mirror-to-mirror cavity length of 150λ. These resonators were designed with a narrow aperture (W~10λ) so that losses are dominated by diffraction. FIG. 3A shows the spectrum from a microwave reflection measurement of a single θ=23.4° device mounted on the base plate of a dilution refrigerator which is at temperature of 20 mK. The central mode occurs at 500.24 MHz, corresponding to a 3641.7 m/s speed of sound which is 0.02% lower than the predicted value of 3642.6 m/s. This mode exhibits an internal linewidth $\kappa_i/2\pi$=18.1 kHz [29]. Using Eqn. 3, this represents a factor of 25 decrease in linewidth compared to an equivalent resonator on ST quartz.

In FIG. 3B, we observe a strong dependence of the central mode internal linewidth on θ as the resonators are rotated in 0.1° increments about the wafer surface normal. At room temperature, internal loss is minimized at θ=22.5° which is in strong agreement with our simulations. As the resonators are cooled, the central angle of minimal loss shifts to 23.7°. This is higher than the predicted angle of minimal diffraction (23.4°), but this discrepancy can be understood as a result of the velocity profile asymmetry. As the aperture width W is reduced, higher angle wave vectors with non-symmetric beam-steering increasingly contribute to the transduced wavefront. This produces an additional width-dependent effective beam-steering $\eta_{eff}$ which is not described by Eqn. 1. This phenomenon shifts the angle of minimal loss from 23.4° to 23.7°, an effect discussed in more detail below in the supplementary material. For wider-aperture devices, we expect the angle of minimal loss to shift back to 23.4° as $\eta_{eff}$ approaches 0°.

Figure 4:
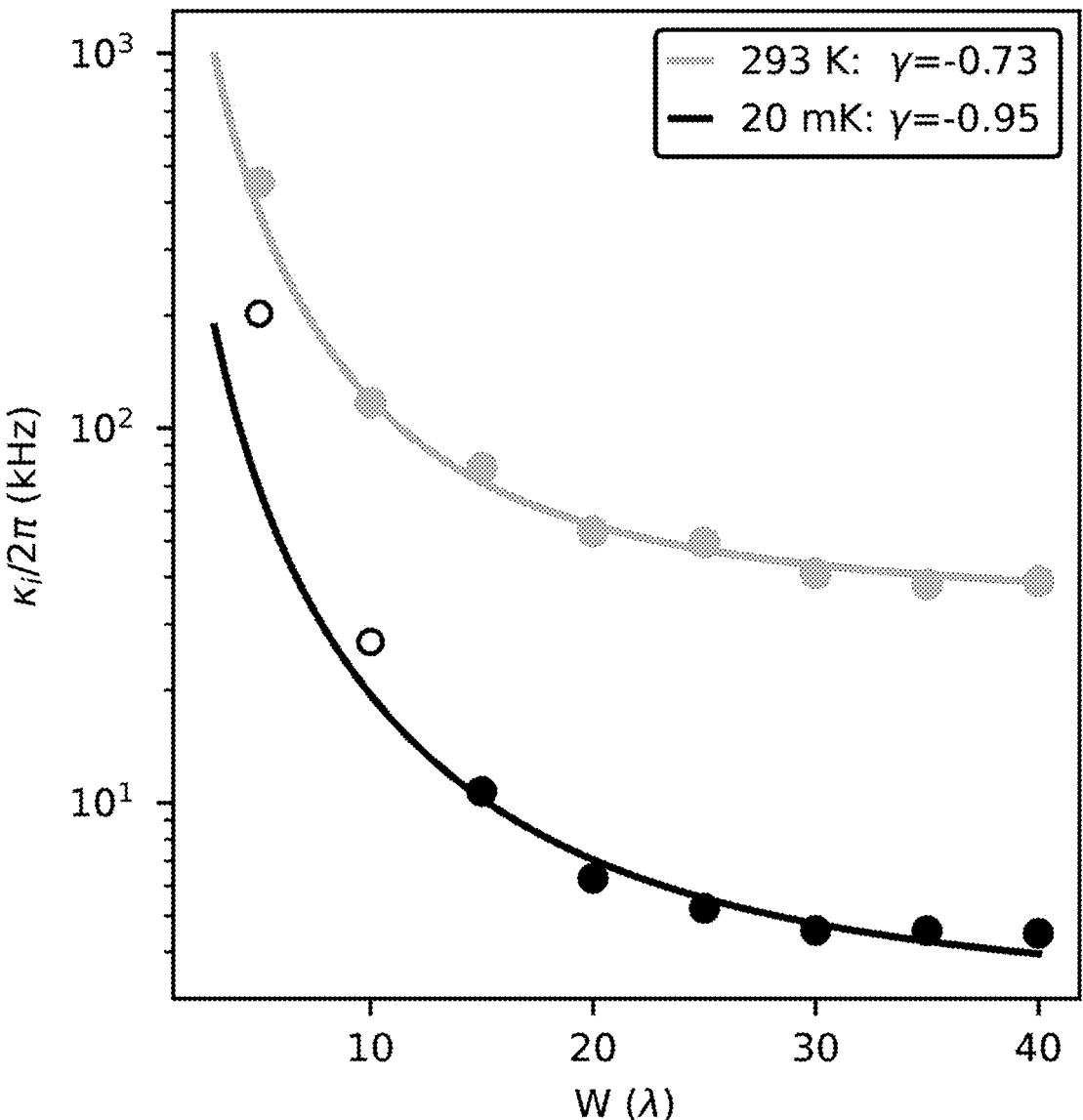
FIG. 4 is a plot showing measurements of the diffraction parameter $\gamma$. The internal linewidths of SAW resonators were measured at room temperature and 20 mK which sweep the width of the acoustic aperture. The solid lines are best fits. The open circles show widths for which asymmetric diffraction becomes comparable to the residual second-order diffraction. Fit error bars are smaller than the marker size.

To measure γ, we fabricated a series of SAW resonators at θ=23.4° with aperture widths W ranging from 5λ to 40λ. In FIG. 4, we observed at both room temperature and 20 mK a monotonic decrease in internal loss as the aperture width W of these devices is increased. We fit the data to Eqn. 3 and found that the substrate exhibits γ=−0.73±0.01 and γ=−0.95±0.01 at room temperature and 20 mK, respectively. At 20 mK, the apparent decrease in loss with increasing aperture width W saturates at W=30λ, for which the device demonstrates $\kappa_i/2\pi$=4.5 kHz. This corresponds to an internal quality factor of 110,000, which is on the order of state-of-the-art SAW resonators [32]. Notably, the fit diverges for the narrowest resonators with W≤10λ measured at 20 mK. At these widths, odd-order contributions to diffraction loss from the asymmetric surface velocity begin to dominate and Eqn. 3 becomes inadequate for describing these losses.

There are two approaches to reducing these residual beam-steering losses: compensate for $\eta_{eff}$ with device geometry or choose an orientation for which all odd-order derivatives of v(θ) vanish. Preliminary experiments suggest that it is possible to mitigate $\eta_{eff}$ loss by fabricating resonators which have a mirror aperture slightly wider than the IDT aperture W to capture the misaligned portion of the beam. Alternatively, the phenomenon of narrow-aperture-induced effective beam-steering can be eliminated entirely by choosing an orientation which lies along a crystalline symmetry axis so that the velocity profile is fully symmetric about the propagation axis. Unfortunately, of the two symmetry-axis

TABLE 1

| φ, θ (°) | | \|dη/dφ\| | \|dγ/dφ\|(°⁻¹) | v (m/s) | Type | k²(%) |
|---|---|---|---|---|---|---|
| 1 | 40.2, 23.4 | 0.41 | 0.003 | 3643 | R | 0.16 |
| 2 | −23.1, 34.9 | 0.09 | 0.08 | 3374 | SH | 0.15 |
| 3 | 86.0, 90.0 | ~0 | 0.07 | 3890 | R | ~0 |
| 4 | 68.9, 90.0 | ~0 | 0.37 | 3778 | SH | 0.03 |
| 5 | 16.5, 90.0 | ~0 | 0.17 | 3379 | SH | 0.10 |
| 6 | −19.3, 90.0 | ~0 | 0.2 | 3765 | R | ~0 |

ψ = 0° 5-K quartz cuts

R-polarized SAW orientations identified in Table 1, both exhibit very low $k^2$. Doubly-rotated cuts, in which $\psi \neq 0°$, may yield MD orientations of quartz with both greater symmetry in $v(\theta)$ and nonzero $k^2$.

Figures 5A, 5B, 5C, 5D:
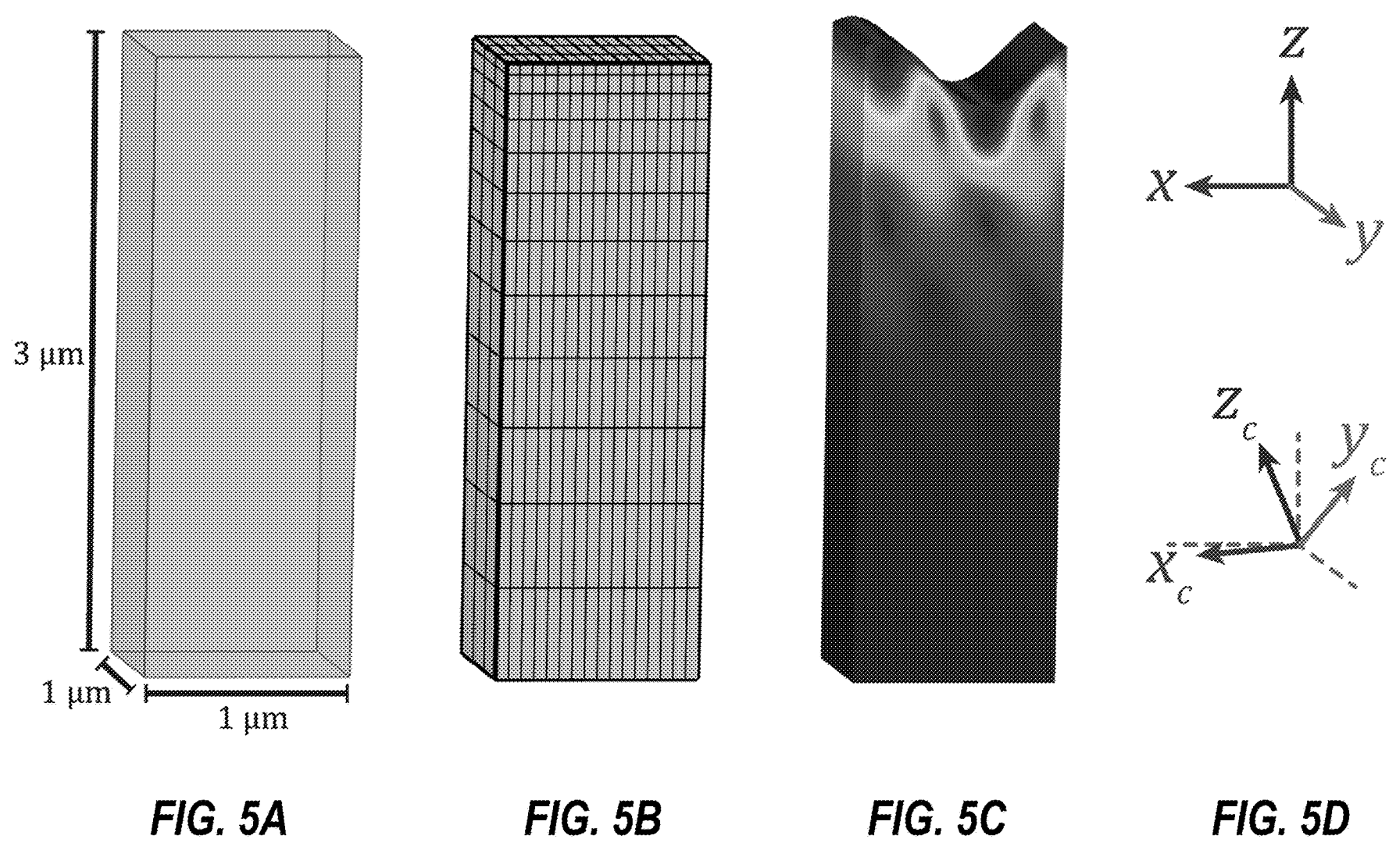

Improving the lifetimes of mechanical resonators coupled to superconducting circuits is critical for maximizing the capabilities of cQAD systems. By discovering a substrate which naturally suppresses SAW diffraction losses, we have provided a solution to the dominant loss source observed in previous SAW-qubit devices [12]. This will allow this class of devices to be pushed further into the strong-dispersive regime to facilitate the exploration of multimodal quantum information processing [12, 33, 34]. COLD quartz may also be useful in the creation of low-loss cryogenic delay lines, phononic waveguides, and electro-acoustic phase modulators [35-39]. Crystallographic optimization has become less common in recent decades as standard crystal orientations for acoustic devices have emerged. In studying a non-standard orientation of quartz, we highlight the remaining utility of crystallographic engineering for quantum applications. Supplementary Material Unit Cell Simulations Calculating velocity for a particular crystallographic orientation is accomplished with unit cell simulations. FIG. 5A shows the unit cell, which is a rectangular prism of dimensions $(1 \times 1 \times 3)$ μm. Pairs of periodic boundary conditions are prescribed on both longitudinal (x) and transverse (γ) boundaries. The SAW wavelength, λ, is determined by the longitudinal width. We find that a unit cell height 3λ and an absorbing condition on the bottom boundary sufficiently mitigate any consequences of evanescent SAW bulk energy being reflected back from the lower boundary. FIG. 5B shows a typical meshing, which consists of 16, 3, and 12 elements in the x, y, and z dimensions, respectively. With eigenfrequency studies, we identified SAW modes and calculated the phase velocity from the frequency and wavelength. FIG. 5C shows the eigenmode for COLD quartz. To specify a specific crystal orientation, we rotated the crystallographic axes relative to the standard coordinate system, as illustrated in FIG. 5D.

Electromechanical Coupling

The electromechanical coupling coefficient $k^2$ is defined by $$k^2 = 2 \frac{v_f - v_s}{v_f}, \tag{4}$$

where $v_f$ and $v_s$ are the free and shorted velocities of a SAW propagating on a substrate [1]. The shorted velocity corresponds to a surface with an idealized metal coating that shorts the longitudinal component of the electric field; we simulated this by adding a grounding boundary condition to the top boundary. We use piezoelectric tensors corresponding to room temperature values and repeat the eigenfrequency search with 1° resolution over the parameter space.

Figure 6:
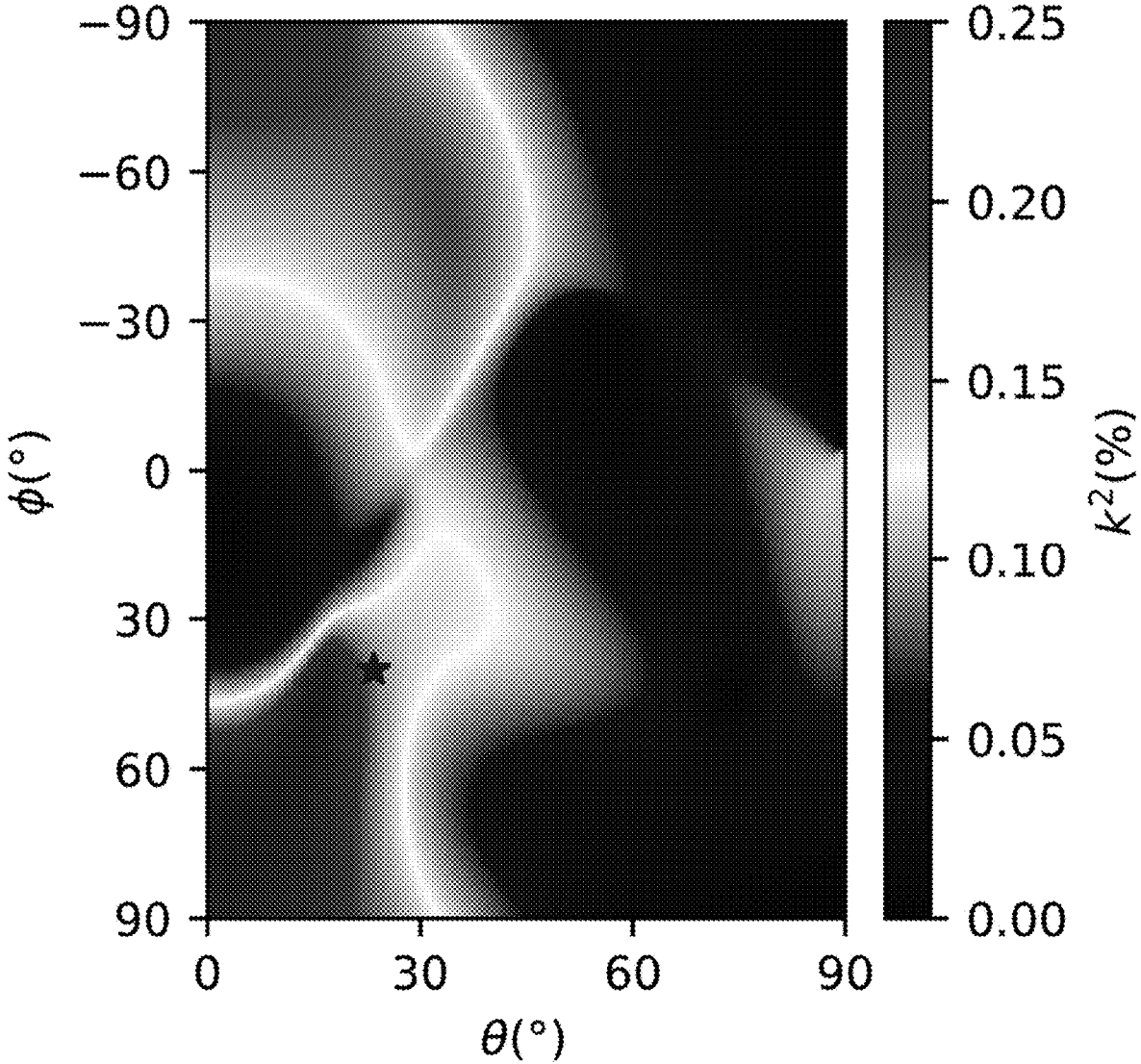
FIG. 6 is a plot of the simulated electromechanical coupling coefficient $k^2$ in the $\psi=0°$ parameter space.

FIG. 6 shows the simulated values of $k^2$ for the quartz parameter space where $\psi = 0°$. For ST quartz $(0°, -47.25°, 0°)$, we simulated $k^2 = 0.139\%$, which agrees with the literature value 0.14% [40]. We simulated that COLD quartz exhibits $k^2 = 0.161\%$.

Effective Beam-Steering

To understand the effect of velocity profile asymmetry on SAWs, we simulated far-field SAW propagation with the angular spectrum of waves technique [41]. The SAW displacement field is proportional to $$f(x, z) = \frac{1}{\pi} \int_{-\infty}^{\infty} \frac{1}{k_x} \sin\left(\frac{k_x W}{2}\right) \exp[i k_x x + i k_z(k_x) x] dk_x, \tag{5}$$

where x and z are the transverse and longitudinal coordinates, W is the width of a transducer launching SAWs along the x axis from $-W/2$ to $W/2$, and $k_x$ and $k_z$ are the components of the wave vector in the x and z directions given that $$k_z(k_x)^2 = k(\hat{k})^2 - k_x^2, \text{ where} \tag{6}$$

$$k(\hat{k}) = 2\pi f / v(\hat{k}), \tag{7}$$

Figure 7:
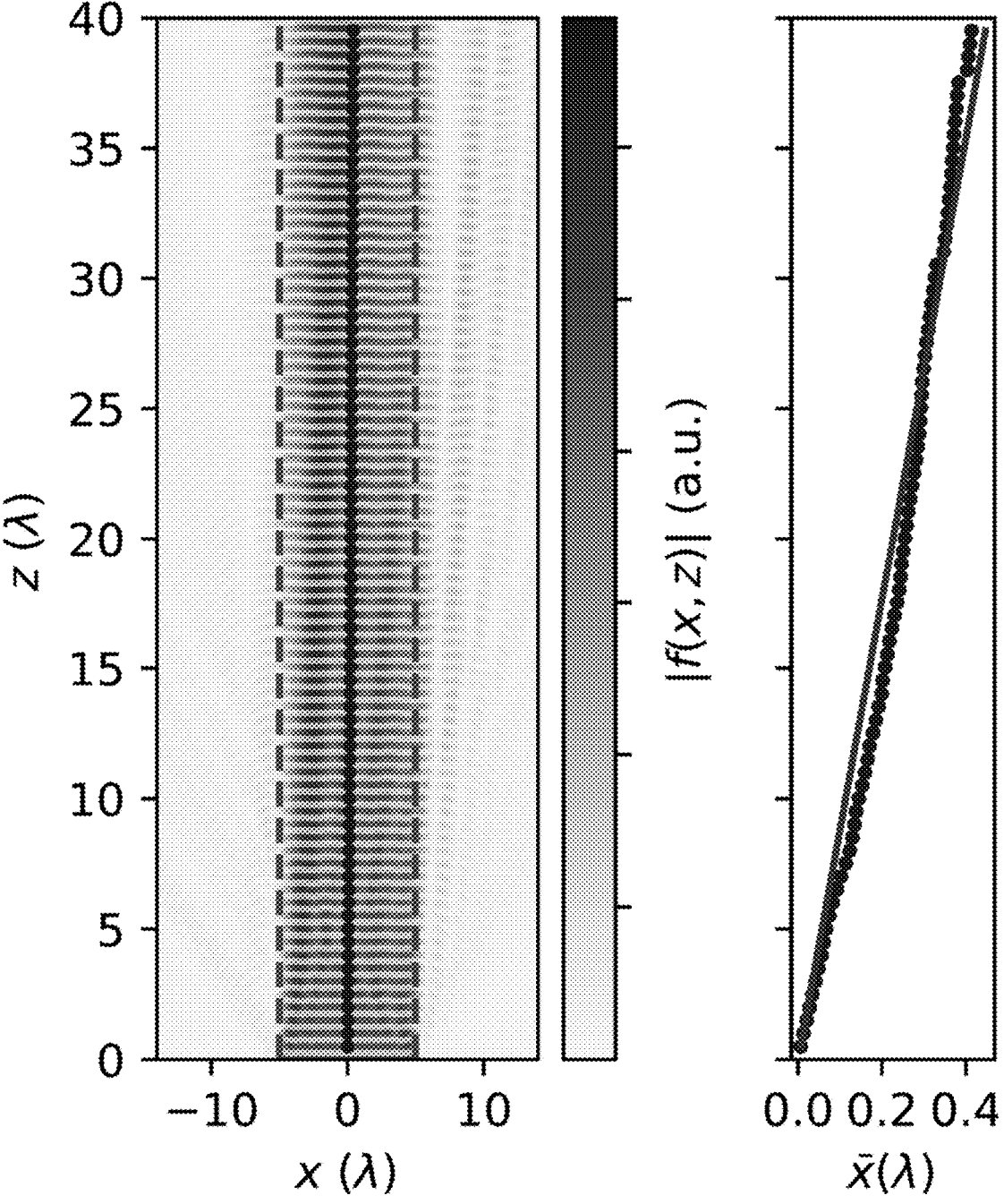
FIG. 7A is a plot of the simulated diffractive field for a $W=10\lambda$ transducer along z=0 at an orientation of $(0°, 40.2°, 23.4°)$. Dashed lines show fictitious cavity boundaries and black circles mark the center of beam intensity $\bar{x}$ for each wavefront.
FIG. 7B shows FIG. 7A expanded near x=0.

$v(\hat{k})$ is the phase velocity in wave-vector direction k and f is the frequency. In FIGS. 7A and 7B, we show the results of simulations of the diffractive field from a 10λ transducer at an orientation of $(0°, 40.2°, 23.4°)$ with a velocity profile generated from FEM unit cell simulations. For each peak in the longitudinal profile along z of the diffractive field, we calculated the weighted center of intensity $\bar{x}$, $$\bar{x} = \frac{\int x f(x)^2 dx}{\int f(x)^2 dx}, \tag{8}$$

and plot this both on the figure and below as a function of z. The center of intensity shifts approximately linearly against z, corresponding to an effective beam-steering $\eta_{eff} \approx 0.6°$.

This phenomenon can be attributed to the asymmetry of the velocity profile. The ideal minimally-diffracting profile $v(\theta) \propto \cos(\theta)$ for all $\theta$ produces an angular beam-steering profile $\eta(\theta) = -\theta$ which facilitates uniaxial transduction of SAWs. However, it is generally sufficient to match the ideal profile for only several degrees about the maximum; wavevector contributions are most significant from these angles. Indeed, the COLD quartz velocity profile approximates a cosine well for $\pm 2°$ around 23.4° before deviating. This deviation is necessarily asymmetric as COLD quartz is not oriented along a crystalline symmetry axis. In particular, the high-angle side $(\theta > 23.4°)$ diverges more quickly and SAWs transduced at these angles do not exhibit large enough beam-steering to achieve an MD wavefront. Contributions from these angles will thus 'steer' the propagating SAW towards higher angles, and $\eta_{eff}$ will be minimized at some higher angle. The degree to which a given wave vector-direction k contributes to the propagating field is dependent on the width of transducer; this is captured in Eqn. 5 by the sinc-term $\sin(k_x W/2)/k_x$. The narrower the IDT aperture W1, the more impactful these high-angle deviations become, contributing to a higher angle at which $\eta_{eff}$ is minimized.

Figure 8:
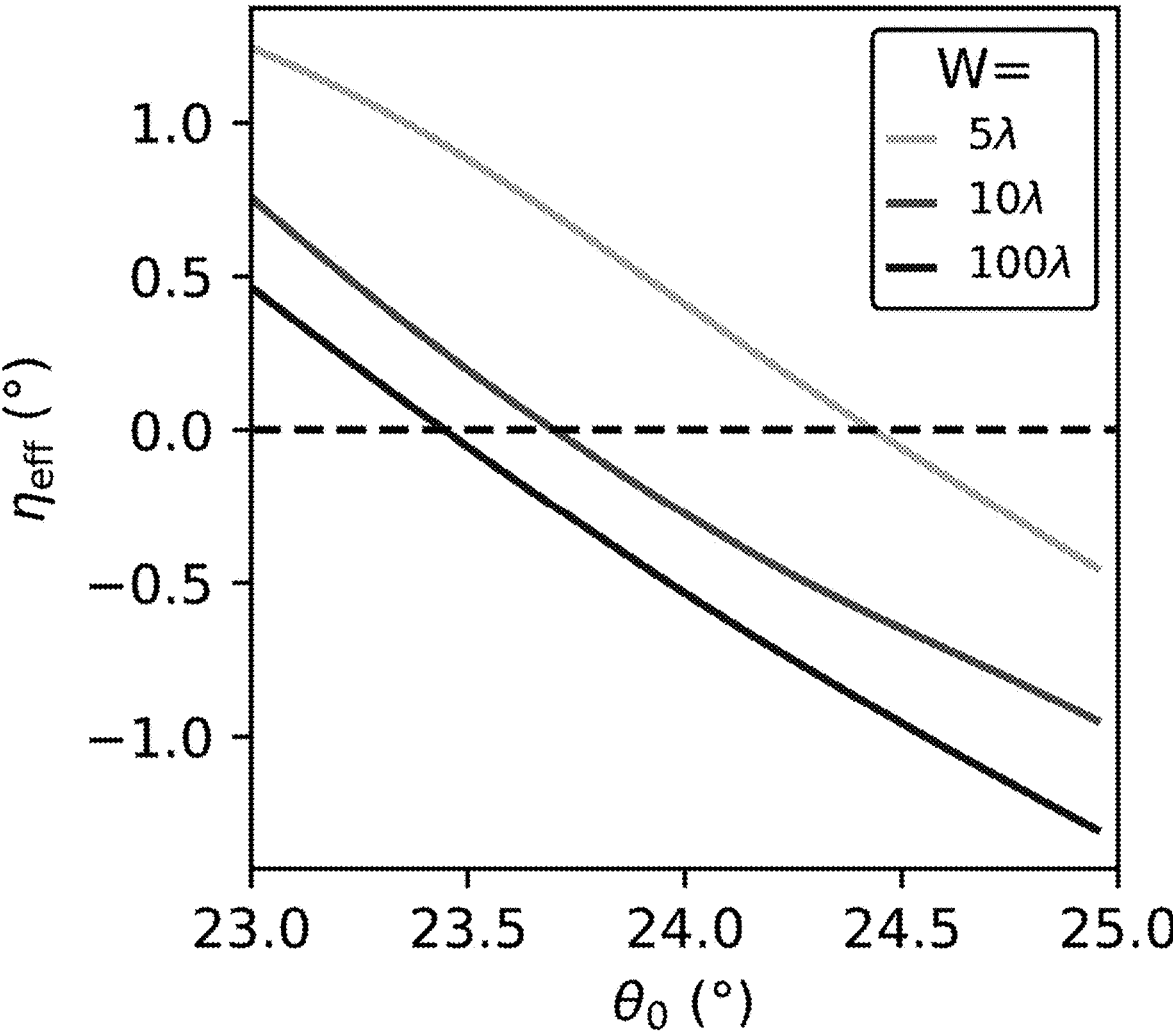
FIG. 8 is a plot of simulated effective beam-steering angle $\eta_{eff}$ as a function of transduction angle $\theta_0$ for IDTs of several widths.

FIG. 8 is a plot of the simulated effective beam-steering angle $\eta_{eff}$ as a function of transduction angle $\theta_0$ for IDTs of several widths. In the case of a very wide aperture (e.g., $W \geq 100\lambda$), the effective beam-steering is minimized at 23.4°; this transducer is predominantly sampling wave-vectors in the idealized region of the velocity profile and thus agrees with the predictions of Eqn. 1. The 10λ IDT minimizes effective beam-steering at 23.7°, which strongly agrees with the data in FIG. 7. Reducing the aperture width W to 5λ shifts the angle of minimal effective loss to 24.4°.

For wider aperture resonators (W≥15λ), this phenomenon is largely negligible. For narrow-aperture devices, however, mitigating this added source of loss may be necessary. This can be accomplished by shifting the orientation of the transducer to the angle of minimal $\eta_{eff}$ or by widening the mirror width compared to the IDT aperture W.

Fabrication

Photoresist patterning was performed with an ASML 5500/100D Wafer Stepper, which supports a 400 nm resolution and 90 nm alignment between lithographic layers. This allows for excellent angular precision while using optical lithography; the smallest device feature size is 910 nm. Wafer preparation began with a Nanostrip etch to remove residual organics followed by evaporation of a 25 nm aluminum film covering the entire 3-inch wafer which will later form the metallized features. Photoresist (nLOF 2020) was then spun onto the wafer, and alignment mark patterns for the wafer stepper were exposed in negative. A 10-nm layer of titanium and a 100-nm layer of gold were evaporated and the films were lifted off to leave behind the alignment marks.

Device fabrication is a simple two layer process for one-port SAW resonators. First, SPR660 photoresist was spun onto the wafer and the stepper was used to pattern regions where the aluminum film was to be etched away. This layer defined the CPW, IDT, and cavity regions. The metal was etched with Transene etchant type A. Photoresist was re-spun and Bragg mirror gratings were patterned in the cavity region. The mirror gratings were etched into the quartz with an Oxford PlasmaLab ICP-380 using fluorine. The target depth for this etch was 73 nm or h/λ=1%, which was found to yield a 1.5% reflectivity per grating element.

Additional Embodiments

Figure 9:
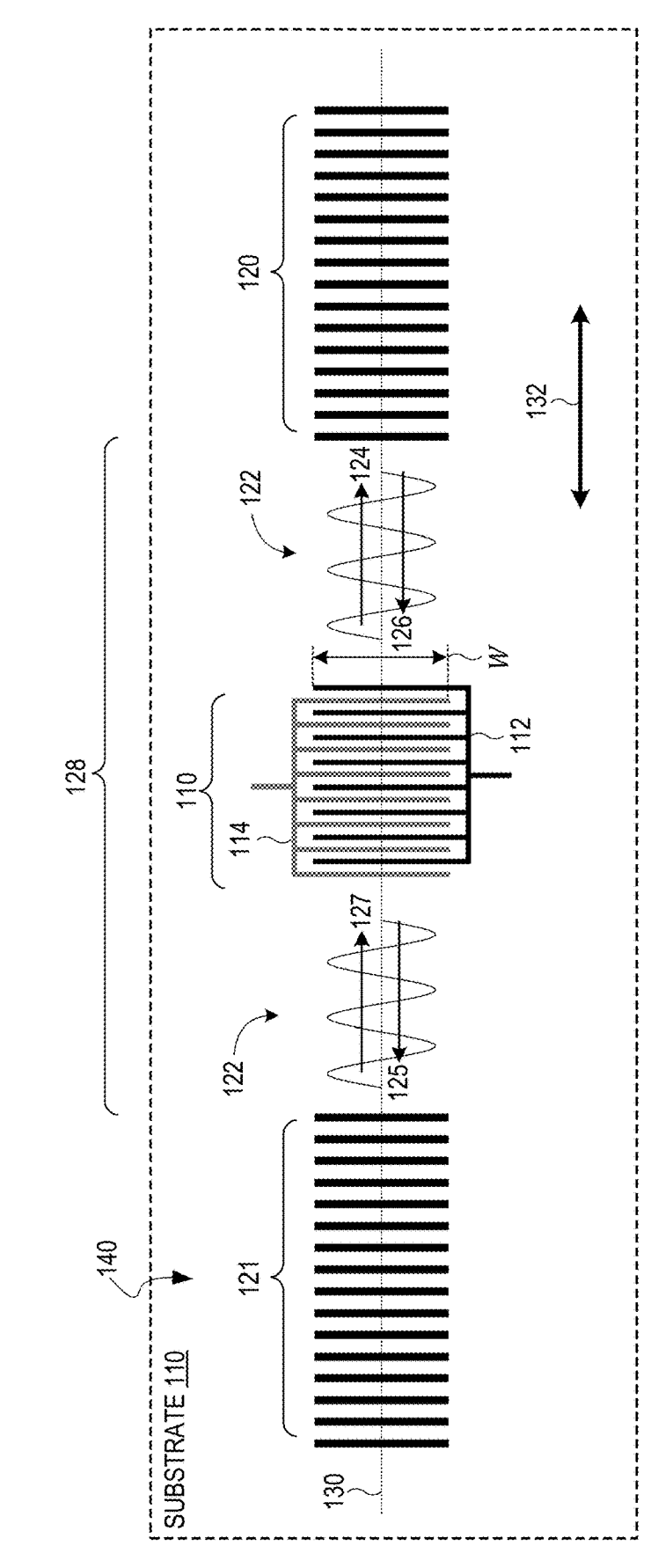
FIG. 9 is a functional diagram of a SAW resonator, in embodiments.

FIG. 9 is a functional diagram of a SAW resonator 900, in accordance with some of the present embodiments. The SAW resonators 100 of FIG. 1A and 100' of FIG. 1B are examples of the SAW resonator 900 of FIG. 9. The SAW resonator 900 includes a substrate 110 formed from an anisotropic crystal. The SAW resonator 900 includes the first acoustic reflector 120 and the second acoustic reflector 121 of FIGS. 1A and 1B. The reflectors 120 and 121 face each other to form an acoustic cavity 128 therebetween. The acoustic cavity 128 has a cavity axis 130 that picks out one direction in space along the surface 140. Specifically, the cavity axis 130 is parallel to a crystallographic orientation 132 of the anisotropic crystal such that the SAW resonator 900 is minimally diffracting at cryogenic temperatures.

In embodiments, the term "cryogenic" refers to temperatures accessible via liquid-nitrogen cooling (i.e., less than 77 K). In some of these embodiments, the cryogenic temperatures are less than 10 K or 4.2 K, which are accessible via liquid-helium cooling. Temperatures as low as a few millikelvin can be achieved with helium dilution refrigerator. Accordingly, the present embodiments may be used with such dilution refrigerators or other cryogenic devices.

There are several ways to excite modes of the acoustic cavity 128. In the example of FIG. 9, the anisotropic crystal forming the substrate 110 is piezoelectric and a pair of electrodes 112 and 114 are located between the acoustic reflectors 120 and 121. By driving the electrodes 112 and 114 with an oscillating signal, the inverse piezoelectric effect generates SAWs 122 that propagate within the acoustic cavity 128. The electrodes 112 and 114 may be configured as an interdigitated transducer (IDT). Specifically, the electrodes 112 and 114 are shaped with "fingers" that alternate, as shown in FIGS. 1A, 1B, and 9. Overlap between the fingers in the direction transverse to the cavity axis 130 defines an aperture width W of two opposing acoustic apertures of the IDT that face the acoustic reflectors 120 and 121. The electrodes 112 and 114 may be fabricated, for example, using lithography.

The SAWs 122 travel in directions 124 and 125, parallel to the cavity axis 130 and along the surface 140 of the substrate 110, toward the acoustic reflectors 120 and 121. The acoustic reflectors 120 and 121 at least partially reflect the SAWs 122 to create reflected SAWs that propagate along directions 127 and 126, respectively. Reflection of SAWs 122 back-and-forth between the acoustic reflectors 120 and 121 can therefore excite one or more modes of the acoustic cavity 128, thereby transferring energy from the SAWs 122 to the cavity modes. Coupling of energy from the SAWs 122 into the cavity mode varies with the detuning between the frequency of the SAWs 122 and the resonance frequencies of the cavity modes. The frequency of the SAWs 122 can be adjusted, in part, by the interdigit spacing of the fingers of the electrodes 112 and 114.

In FIG. 9, each of the acoustic reflectors 120 and 121 is shown as a Bragg reflector formed from a stack of alternating layers of materials having high and low acoustic impedances. Such Bragg reflectors may be created by etching into, or depositing material onto, top surface 140 of the substrate 110. A different type of acoustic reflector or mirror known in the art may be used instead.

In some embodiments, the acoustic cavity 128 is excited without electrical transduction. In these embodiments, the SAW resonator 900 may exclude the electrodes 112 and 114. Furthermore, the anisotropic crystal forming the substrate 110 need not be piezoelectric. In one of these embodiments, modes of the acoustic cavity 128 are excited with phonons that are transmitted through one of the acoustic reflectors 120 and 121. In another of these embodiments, a SAW may be launched into the acoustic cavity 128 at a non-zero angle relative to the cavity axis 130. In this case, diffraction or scattering may be used to couple some of the energy of the SAW into a cavity mode. Another mechanism for coupling energy into the acoustic cavity 128 may be used without departing from the scope hereof.

The substrate 110 may be formed from any anisotropic crystal known in the art. In some embodiments, the crystal is piezoelectric. As described above, quartz (e.g., α-quartz) is one such piezoelectric crystal. Other examples of piezoelectric crystals include, but are not limited to, silicon carbide (SiC), gallium arsenide (GaAs), zinc oxide (ZnO), aluminum nitride (AlN), lithium niobate (LiNbO₃), and lithium tantalate (LiTaO₃), and potassium niobate (KNbO₃). Examples of non-piezoelectric crystals include, but are not limited to, sapphire and silicon. It should be understand that the particular values of the Euler angles (ψ, φ, θ) described above apply only to the MD orientation of α-quartz at cryogenic temperatures. Since the MD orientation depends on crystal properties, the values of the Euler angles (ψ, φ, θ) for the MD orientation will be different than those presented above when the substrate 110 is fabricated from an anisotropic crystal other than α-quartz. The substrate 110 may be cut such that the MD orientation is parallel to an edge (e.g., the length) of the substrate 110. In this case, the acoustic reflectors 120 and 121 can be fabricated such that the cavity axis 130 is parallel to the edge.

Propagation of SAWs with minimal diffraction can also be used to reduce energy loss in devices other than resonators. Accordingly, the present embodiments include other types of SAW devices that operate with MD orientations of anisotropic crystals at cryogenic temperatures. For examples, SAW filters and delay lines use input and output transducers fabricated on a piezoelectric substrate. The input and output transducers may be positioned such that the transmission direction of SAWs from the input transducer to the output transducer is aligned with an MD orientation of the piezoelectric substrate (at cryogenic temperatures). Advantageously, the input and output transducers can be constructed with narrower apertures, as compared to SAW filters that do not use an MD orientation. Alternatively, the input and output transducers can be separated by a greater distance.

REFERENCES

[1] D. Morgan, Surface Acoustic Wave Filters: With Applications to Electronic Communications and Signal Processing (Academic Press, 2010).

[2] Y. Chu and S. Groblacher, "A perspective on hybrid quantum opto- and electromechanical systems," Appl. Phys. Lett. 117, 150503 (2020).

[3] P. Kharel, Y. Chu, M. Power, W. H. Renninger, R. J. Schoelkopf, and P. T. Rakich, "Ultra-high-q phononic resonators on-chip at cryogenic temperatures," APL Photonics 3, 066101 (2018).

[4] G. S. MacCabe, H. Ren, J. Luo, J. D. Cohen, H. Zhou, A. Sipahigil, M. Mirhosseini, and O. Painter, "Nanoacoustic resonator with ultralong phonon lifetime," Science 370, 840-843 (2020).

[5] M. J. Bereyhi, A. Arabmoheghi, A. Beccari, S. A. Fedorov, G. Huang, T. J. Kippenberg, and N. J. Engelsen, "Perimeter modes of nanomechanical resonators exhibit quality factors exceeding $10^9$ at room temperature," Phys. Rev. X 12, 021036 (2022).

[6] S. Maity, L. Shao, S. Bogdanovid, S. Meesala, Y.-I. Sohn, N. Sinclair, B. Pingault, M. Chalupnik, C. Chia, L. Zheng, et al., "Coherent acoustic control of a single silicon vacancy spin in diamond," Nat. Commun. 11, 193 (2020).

[7] M. Mirhosseini, A. Sipahigil, M. Kalaee, and O. Painter, "Superconducting qubit to optical photon transduction," Nature 588, 599-603 (2020).

[8] R. Delaney, M. Urmey, S. Mittal, B. Brubaker, J. Kindem, P. Burns, C. Regal, and K. Lehnert, "Superconducting-qubit readout via low-backaction electro-optic transduction," Nature 606, 489-493 (2022).

[9] R. A. DeCrescent, Z. Wang, P. Imany, R. C. Boutelle, C. A. McDonald, T. Autry, J. D. Teufel, S. W. Nam, R. P. Mirin, and K. L. Silverman, "Tightly confined surface acoustic waves as microwave-to-optical transduction platforms in the quantum regime," Phys. Rev. Applied 18, 034067 (2022).

[10] K. J. Satzinger, Y. Zhong, H.-S. Chang, G. A. Peairs, A. Bienfait, M.-H. Chou, A. Cleland, C. R. Conner, E. Dumur, J. Grebel, et al., "Quantum control of surface acoustic-wave phonons," Nature 563, 661-665 (2018).

[11] Y. Chu, P. Kharel, T. Yoon, L. Frunzio, P. T. Rakich, and R. J. Schoelkopf, "Creation and control of multi-phonon Fock states in a bulk acoustic-wave resonator," Nature 563, 666-670 (2018).

[12] L. R. Sletten, B. A. Moores, J. J. Viennot, and K. W. Lehnert, "Resolving phonon Fock states in a multimode cavity with a double-slit qubit," Phys. Rev. X 9, 021056 (2019).

[13] E. A. Wollack, A. Y. Cleland, R. G. Gruenke, Z. Wang, P. Arrangoiz-Arriola, and A. H. Safavi-Naeini, "Quantum state preparation and tomography of entangled mechanical resonators," Nature 604, 463-467 (2022).

[14] U. von Lüpke, Y. Yang, M. Bild, L. Michaud, M. Fadel, and Y. Chu, "Parity measurement in the strong dispersive regime of circuit quantum acousto-dynamics," Nat. Phys. 18, 794-796 (2022).

[15] C. Chamberland, K. Noh, P. Arrangoiz-Arriola, E. T. Campbell, C. T. Hann, J. Iverson, H. Putterman, T. C. Bohdanowicz, S. T. Flammia, A. Keller, et al., "Building a fault-tolerant quantum computer using concatenated cat codes," PRX Quantum 3, 010329 (2022).

[16] P. Arrangoiz-Arriola, E. A. Wollack, M. Pechal, W. Jiang, Z. Wang, T. P. McKenna, J. Witmer, R. V. Laer, A. Cleland, N. Lee, C. J. Sarabalis, P.-J. Stas, and A. H. Safavi-Naeini, "Microwave quantum acoustic processor," in *IEEE MTT-S International Microwave Symposium (IMS)* (IEEE, 2019), pp. 255-258.

[17] C. T. Hann, C.-L. Zou, Y. Zhang, Y. Chu, R. J. Schoelkopf, S. M. Girvin, and L. Jiang, "Hardware-efficient quantum random access memory with hybrid quantum acoustic systems," Phys. Rev. Lett. 123, 250501 (2019).

[18] E. Dumur, K. Satzinger, G. Peairs, M.-H. Chou, A. Bienfait, H.-S. Chang, C. Conner, J. Grebel, R. Povey, Y. Zhong, and A. Cleland, "Quantum communication with itinerant surface acoustic wave phonons," npj Quantum Inf. 7, 173 (2021).

[19] G. Andersson, S. W. John, M. Scigliuzzo, R. Borgani, M. O. Tholen, J. R. Hernandez, V. Shumeiko, D. B. Haviland, and P. Delsing, "Squeezing and multimode entanglement of surface acoustic wave phonons," PRX Quantum 3, 010312 (2022).

[20] H. Raniwala, S. Krastanov, M. Eichenfield, and D. Englund, "A spin-optomechanical quantum interface enabled by an ultrasmall mechanical and optical mode volume cavity," arXiv:2202.06999 (2022).

[21] H. Wang and I. Lekavicius, "Coupling spins to nanomechanical resonators: Toward quantum spin-mechanics," Appl. Phys. Lett. 117, 230501 (2020).

[22] A. J. Heinrich, W. D. Oliver, L. M. Vandersypen, A. Ardavan, R. Sessoli, D. Loss, A. B. Jayich, J. Fernandez-Rossier, A. Laucht, and A. Morello, "Quantum-coherent nanoscience," Nat. Nanotechnol. 16, 1318-1329 (2021).

[23] M. de Lima, Jr., F. Alsina, W. Seidel, and P. Santos, "Focusing of surface-acoustic-wave fields on (100) GaAs surfaces," J. Appl. Phys. 94, 7848-7855 (2003).

[24] M. E. Msall and P. V. Santos, "Focusing surface-acoustic-wave microcavities on GaAs," Phys. Rev. Appl. 13, 014037 (2020).

[25] M. Goryachev, D. L. Creedon, S. Galliou, and M. E. Tobar, "Observation of Rayleigh phonon scattering through excitation of extremely high overtones in low-loss cryogenic acoustic cavities for hybrid quantum systems," Phys. Rev. Lett. 111, 085502 (2013).

[26] B. Abbott and L. Solie, "A minimal diffraction cut of quartz for high performance saw filters," in *IEEE Ultrasonics Symposium. Proceedings. An International Symposium* (IEEE, 2000), pp. 235-240.

[27] J. Cowperthwaite and M. P. Da Cunha, "Optimal orientation function for saw devices," in *IEEE International Frequency Control Symposium and PDA Exhibition*

*Jointly with the 17th European Frequency and Time Forum* (IEEE, 2003), pp. 881-887.

[28] ANSI/IEEE Std 176-1978, *IEEE Standard on Piezoelectricity* (IEEE, 1978).

[29] T. Aref, P. Delsing, M. K. Ekström, A. F. Kockum, M. V. Gustafsson, G. Johansson, P. J. Leek, E. Magnusson, and R. Manenti, "Quantum acoustics with surface acoustic waves," in *Superconducting Devices in Quantum Optics* (Springer, 2016), pp. 217-244.

[30] See www.comsol.com for "COMSOL Multiphysics. v. 5.4" (2020).

[31] R. Tarumi, K. Nakamura, H. Ogi, and M. Hirao, "Complete set of elastic and piezoelectric coefficients of α-quartz at low temperatures," J. Appl. Phys. 102, 113508 (2007).

[32] R. Manenti, M. Peterer, A. Nersisyan, E. Magnusson, A. Patterson, and P. Leek, "Surface acoustic wave resonators in the quantum regime," Phys. Rev. B 93, 041411 (2016).

[33] D. Schuster, A. A. Houck, J. Schreier, A. Wallraff, J. Gambetta, A. Blais, L. Frunzio, J. Majer, B. Johnson, M. Devoret, et al., "Resolving photon number states in a superconducting circuit," Nature 445, 515-518 (2007).

[34] B. A. Moores, L. R. Sletten, J. J. Viennot, and K. Lehnert, "Cavity quantum acoustic device in the multimode strong coupling regime," Phys. Rev. Lett. 120, 227701 (2018).

[35] E. B. Magnusson, B. H. Williams, R. Manenti, M.-S. Nam, A. Nersisyan, M. J. Peterer, A. Ardavan, and P. J. Leek, "Surface acoustic wave devices on bulk ZnO crystals at low temperature," Appl. Phys. Lett. 106, 063509 (2015).

[36] M. K. Ekström, T. Aref, J. Runeson, J. Bjorck, I. Boström, and P. Delsing, "Surface acoustic wave unidirectional transducers for quantum applications," Appl. Phys. Lett. 110, 073105 (2017).

[37] Z. He, F. Cai, and Z. Liu, "Guiding acoustic waves with graded phononic crystals," Solid State Commun. 148, 74-77 (2008).

[38] W. Fu, Z. Shen, Y. Xu, C.-L. Zou, R. Cheng, X. Han, and H. X. Tang, "Phononic integrated circuitry and spin-orbit interaction of phonons," Nat. Commun. 10, 2743 (2019).

[39] L. Shao, D. Zhu, M. Colangelo, D. Lee, N. Sinclair, Y. Hu, P. T. Rakich, K. Lai, K. K. Berggren, and M. Loncar, "Electrical control of surface acoustic waves," Nat. Electron. 5, 348 (2022).

[40] T. Aref, P. Delsing, M. K. Ekström, A. F. Kockum, M. V. Gustafsson, G. Johansson, P. J. Leek, E. Magnusson, and R. Manenti, "Quantum acoustics with surface acoustic waves," in Superconducting devices in quantum optics (Springer, 2016) pp. 217-244.

[41] M. Kharusi and G. Farnell, "Diffraction and beam steering for surface-wave comb structures on anisotropic substrates," IEEE Transactions on Sonics and Ultrasonics 18, 35-42 (1971).

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

What is claimed is:

1. A surface-acoustic-wave (SAW) resonator, comprising:
a substrate comprising an anisotropic crystal; and
first and second acoustic reflectors disposed on a surface of the substrate, the first and second acoustic reflectors facing each other to form an acoustic cavity;
wherein an axis of the acoustic cavity is aligned with a crystallographic orientation of the anisotropic crystal such that the SAW resonator is minimally diffracting at cryogenic temperatures.

2. The SAW resonator of claim 1, having a diffraction parameter $\gamma$ such that $-2<\gamma<0$ at the cryogenic temperatures.

3. The SAW resonator of claim 2, the diffraction parameter $\gamma$ being equal to $-1$.

4. The SAW resonator of claim 1, having a beam-steering angle near zero at the cryogenic temperatures.

5. The SAW resonator of claim 1, being minimally diffracting at temperatures less than or equal to 10 K.

6. The SAW resonator of claim 1, each of the first and second acoustic reflectors being a Bragg reflector.

7. The SAW resonator of claim 1, each of the first and second acoustic reflectors being flat.

8. The SAW resonator of claim 1, the anisotropic crystal comprising a piezoelectric crystal.

9. The SAW resonator of claim 8, further comprising first and second electrodes located on the surface of the substrate between the first and second acoustic reflectors.

10. The SAW resonator of claim 9, the first and second electrodes comprising first and second arrays of interdigitated transducers.

11. The SAW resonator of claim 8, the piezoelectric crystal comprising quartz.

12. The SAW resonator of claim 11, the quartz comprising α-quartz.

13. The SAW resonator of claim 11, wherein the crystallographic orientation of the quartz is given by Euler angles $(\psi, \phi, \theta)=(0°, 40.2°, 23.4°)$.

14. The SAW resonator of claim 8, the piezoelectric crystal being selected from the group consisting of silicon carbide (SiC), gallium arsenide (GaAs), zinc oxide (ZnO), aluminum nitride (AlN), lithium niobate ($LiNbO_3$), and lithium tantalate ($LiTaO_3$), and potassium niobate ($KNbO_3$).

15. The SAW resonator of claim 1, the axis of the acoustic cavity being parallel to a length of the substrate.

16. The SAW resonator of claim 1, wherein the crystallographic orientation corresponds to a singly rotated cut of the anisotropic crystal.

17. The SAW resonator of claim 1, wherein the crystallographic orientation corresponds to a doubly rotated cut of the anisotropic crystal.

18. The SAW resonator of claim 1, the acoustic cavity having an acoustic aperture with a width of $40\lambda$ or less, $\lambda$ being an acoustic wavelength.

19. A method comprising exciting a mode of the acoustic cavity of the SAW resonator of claim 1.

20. The method of claim 19, wherein:
the SAW resonator comprises first and second electrodes located on the surface of the substrate between the first and second acoustic reflectors; and
exciting the mode of the acoustic cavity comprises electrically driving the first and second electrodes.

\* \* \* \* \*